(12) United States Patent
Edelstein et al.

(10) Patent No.: US 7,098,050 B1
(45) Date of Patent: Aug. 29, 2006

(54) CORONA BASED CHARGE VOLTAGE MEASUREMENT

(75) Inventors: Sergio Edelstein, Los Gatos, CA (US); Eric F. Bouche, Pleasanton, CA (US); Jianou Shi, Milpitas, CA (US); Shiyou Pei, Saratoga, CA (US); Xiafang Zhang, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 83 days.

(21) Appl. No.: 10/974,270

(22) Filed: Oct. 27, 2004

(51) Int. Cl.
*H01L 31/26* (2006.01)

(52) U.S. Cl. .......................... 438/14; 438/14; 438/710; 324/671

(58) Field of Classification Search .................. 438/14, 438/710; 324/671
See application file for complete search history.

(56) References Cited

U.S. PATENT DOCUMENTS 5,936,408 A * 8/1999 Scaman ...................... 324/537

* cited by examiner

*Primary Examiner*—Andy Huynh
*Assistant Examiner*—Thinh T Nguyen
(74) *Attorney, Agent, or Firm*—Luedeka, Neely & Graham, P.C.

(57) ABSTRACT

A method of measuring electrical characteristics of a gate dielectric. The gate dielectric is local annealed by directing a highly localized energy source at the measurement area, such that the measurement area is brought to an annealing temperature while surrounding structures are not significantly heated. While heating the measurement area, a flow of a gas containing a percentage of hydrogen, deuterium, or water vapor at a flow rate is directed to the measurement area. A charge is inducted on the measurement area and the electrical characteristics of the gate dielectric are measured using non contact electrical probing.

19 Claims, 2 Drawing Sheets

CORONA BASED CHARGE VOLTAGE MEASUREMENT

FIELD

This invention relates to the field of integrated circuit fabrication. More particularly, this invention relates to in-line production monitoring of transistor gate electrical properties using non contact electrical measurement.

BACKGROUND

With modern integrated circuits operating at ever increasing speeds and at ever decreasing powers, control of the gate stack films has become more important, and more difficult than ever before. As the term is used herein, "integrated circuit" includes devices such as those formed on monolithic semiconducting substrates, such as those formed of group IV materials like silicon or germanium, or group III–V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Although there are many important electrical characteristics that define the proper behavior of a gate, some of the most critical issues are gate threshold voltage shift and gate leakage. Because the effective oxide thickness of gates is so thin, and the power is so low, gate threshold voltage shifting and high leakage are fatal to the proper operation of the integrated circuit. The electrical characteristics of the gate are predominantly set at a point in time that occurs relatively early in the integrated circuit fabrication process. These steps include preparation of the semiconducting substrate, deposition of the gate insulation layer, and other related, early occurring steps.

Unfortunately, it is much later in the process before the important electrical characteristics that are defined by these processes can be directly measured, such as by contact probing. At that point, however, any problems with the earlier processes that may negatively effect gate electrical properties will have effected a large number of integrated circuits in the fabrication line, potentially resulting in the waste of large numbers of misprocessed or otherwise damaged integrated circuits.

Prior art methods of checking for such problems earlier in the fabrication process include optical inspection for cleanliness and thickness measurement. However, with effective gate oxide thicknesses dropping to such low levels, such relatively crude methods of inspection have proven to be inadequate.

What is needed, therefore, is a system that overcomes problems such as those described above, at least in part.

SUMMARY

The above and other needs are met by a method of measuring electrical characteristics of a gate dielectric on a semiconductor substrate at a measurement area. The measurement area is locally annealed by directing a highly localized energy source at the measurement area, such that the measured spot is brought to an annealing temperature while surrounding structures are not significantly heated. While locally heating the measurement area, a flow of a gas containing a percentage of at least one of hydrogen and deuterium at a flow rate is directed to the substrate. Also while locally heating the measurement area, the flow of gas is exhausted from the substrate. Some charges are inducted on the locally heated measurement area, and the electrical characteristics of the gate dielectric are measured, preferably using non contact electrical probing.

In this manner, electrical characteristics of the gate structure, which at this point may be no more than a gate insulation layer on top of a semiconducting substrate, can be measured. By inducing a charge on the gate dielectric and using non contact probing, the measurements can be made at a point during the fabrication process before which electrical connections have been formed, thus reducing the length of time between fabrication of the structures and testing of the structures. Further, by locally annealing the gate dielectric in the presence of a hydrogen or deuterium containing gas, such as nitrogen mixed with hydrogen or water vapor containing gases, the gate interface and other conditions are brought to a level where they will be at a point later in the process, thus providing better correlation between the testing accomplished at this point in the process, and the electrical characteristics that will exist at the end of line testing.

In various embodiments according to this aspect of the invention, the highly localized energy source is a laser, a focused light source, or a focused ion or electron beam. The gas is preferably delivered through a single nozzle that is disposed adjacent the measurement area, and is preferably exhausted through a single nozzle that is disposed adjacent the measurement area. Preferably, the annealing temperature is between about twenty centigrade and about fifteen hundred centigrade. The electrical characteristics preferably include at least one of gate leakage, voltage threshold, and carrier mobility. The charge on the measurement area is preferably induced with a corona discharge. The measurement area in some embodiments is formed in a test structure in a scribe line of a substrate on which integrated circuits are formed. The measurement area may be disposed on either a production substrate or on a monitor substrate. The voltage threshold is preferably determined according to the equation:

$$V_{TH} = V_{fb} + 2\varphi_F + \frac{\sqrt{4\varepsilon_{si}qN_A\varphi_F}}{C_{ox}}$$

According to another aspect of the invention there is described a more detailed method of measuring a threshold voltage of a gate. The gate is local annealed by directing a laser at the few micron spot of gate, such that the gate is brought to an annealing temperature as high as about fifteen hundred centigrade while surrounding structures are not significantly heated. While heating the gate dielectric, a flow of a gas containing a percentage of hydrogen, water vapor, or deuterium, at a flow rate is delivered to the measurement area through a single nozzle that is disposed adjacent the measurement area. Also while heating the gate, the flow of gas is exhausted from the substrate through a single nozzle that is disposed adjacent the gate. A charge is induced on the gate, and the voltage threshold of the gate is measured using non contact electrical probing.

According to yet another aspect of the invention there is described an apparatus for measuring electrical characteristics of a gate on a substrate, which apparatus includes a local annealing station. A laser brings the gate to an annealing temperature as high as about fifteen hundred centigrade while surrounding structures are not significantly heated. A first nozzle is disposed adjacent the gate, and delivers a flow of a gas containing a percentage of hydrogen, deuterium, or wafer vapor at a flow rate to the gate. A second nozzle is disposed adjacent the gate, and exhausts the flow of the gas from the substrate. Means are provided for inducing a charge on the measurement area, and non contact electrical probes measure the voltage threshold of the gate. The apparatus preferably includes a probe work function calibration station with a stable surface, such as noble metal, crystal structured or amorphous structured conducting or semiconducting surfaces, enclosed in a heatable, protectable environment, which provides a reference to measure the electrical characteristics of the gate. Substrate handling means preferably automatically move the substrate to different stations within the apparatus.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
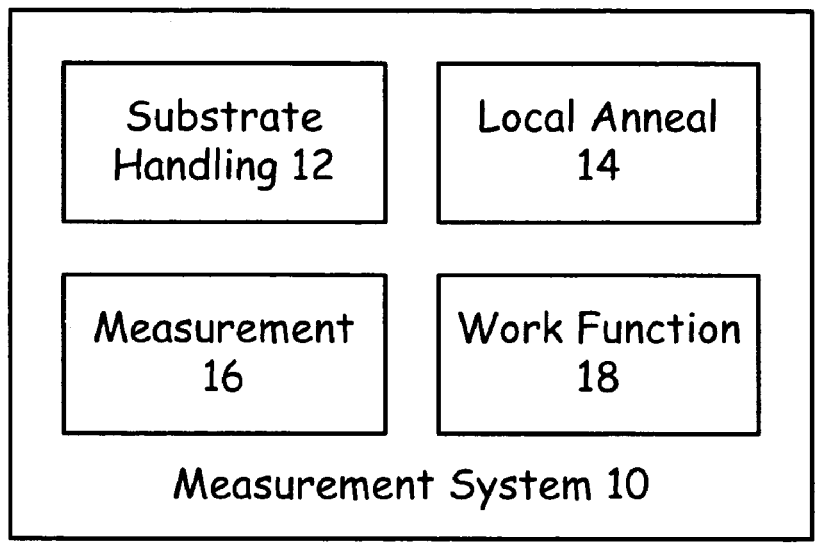
FIG. 1 is a functional block diagram of an apparatus according to a preferred embodiment of the present invention.

With reference now to FIG. 1, there is depicted a functional block diagram of an apparatus 10 for measuring electrical characteristics of a gate, according to a preferred embodiment of the present invention. The measurement system 10 preferably includes substrate handling systems 12. In a most preferred embodiment, the structures that are to be measured by the system 10 are formed on substrates, such as the semiconducting wafers that are used for forming integrated circuits. Thus, the substrate handling system 12 is preferably adapted to handle such substrates, such as by off loading them from cassettes, moving them to various locations throughout the system 10 as described in more detail below, and loading them back into cassettes.

The measurement system 10 preferably uses charge voltage methods to measure the electrical characteristics of the gate dielectric, as described in more detail below. Unfortunately, the electrical characteristics of the gate, or the gate insulation layer, at an early point in processing are not the same as they will be at a later point in processing. For example, it is preferred to make the measurements as enabled by the measurement system 10 at a relatively early point in the integrated circuit fabrication process, so that the loss of a large amount of misprocessed or otherwise unsuitable production substrates in the line can be avoided.

Thus, the measurements are preferably made after as soon after the well implant and gate oxidation steps as is feasible. Further, the measurements can be made either prior to or after the gate structure itself and source drain regions are defined. If the gate structure has been defined, then one method is used, and if the gate structure has not been defined, then another method is used, both as described in more detail below. For ease in describing the embodiments of the invention herein, the term gate is variously used to indicate either a gate insulation layer that has been formed into a gate structure, or a gate insulation layer that has not yet been etched into a gate structure.

Because the gate does not yet have the electrical properties at this point in the process that it will have later on in the process, measurement of the electrical properties can lead to false indications of passing or failing electrical characteristics. For example, the interface trap density of structures at this point in the processing may be one or two orders of magnitude greater than it will be at the end of line testing. Such differences can dramatically effect the measurements that are taken at this point in the processing.

Figure 2:
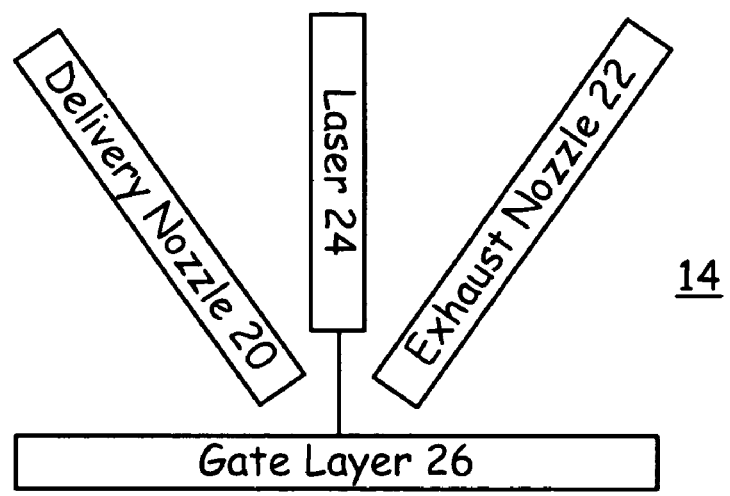
FIG. 2 is a functional block diagram of a local anneal station of the apparatus of FIG. 1, according to a preferred embodiment of the present invention.

To compensate, at least in part, for such differences, the gates to be measured are preferably local annealed, such as in the local anneal station 14 as generally depicted in FIG. 1, and as depicted in greater detail in FIG. 2. The gate insulation layer 26 is preferably annealed with an energy source that is capable of being focused in a manner so as to concentrate the delivery of the annealing energy to a very small measurement area. In this manner, the structure to be annealed is given the heat desired for the anneal process, while other structures, even structures that are disposed adjacent or otherwise in close proximity to the annealed structure, are not substantially effected by the annealing process. Most preferably, the energy source is a laser 24 with a very small incident spot size.

The structure that is annealed and tested is preferably a test structure that is formed in the scribe line of a production wafer. Alternately, a plurality of test structures can be formed across the surface of a monitor wafer. Alternately still, production gates could be tested on production wafers. However, the processing as described herein in advance of the testing may render the production gates unfit for their intended purposes at later points in the processing. Thus, most preferably a plurality of test structures are formed in the scribe lines of production wafers.

While the laser 24 is annealing the desired structure on the gate insulation layer 26, a delivery nozzle 20 preferably delivers a flow of a hydrogen containing gas. The nozzle 20 preferably delivers the gas to a highly localized area, such as to a very small area surrounding the annealed measurement area. Thus, the delivery nozzle 20 is preferably a single nozzle that is disposed adjacent the gate to be annealed, rather than being disposed elsewhere within the anneal chamber. At the same time, an exhaust nozzle 22 preferably withdraws the gas, so that it does not permeate the anneal chamber, causing reactions with other structures on the substrate. Once again, the exhaust nozzle 22 is most preferably a single nozzle that is disposed adjacent the gate to be annealed, rather than being disposed elsewhere within the anneal chamber.

By annealing the measurement area in the presence of hydrogen, deuterium, or water vapor in this manner, factors such as the interface trap density are locally reduced to levels that more nearly approximate those that they will have at later points in the fabrication process, such as at the end of line test. Thus, the measurements that are taken at this point in the fabrication process will more nearly correlate with the measurements at the end of line testing. In this manner, a better indication is provided of whether the gates have been formed with the proper electrical characteristics.

Figure 3:
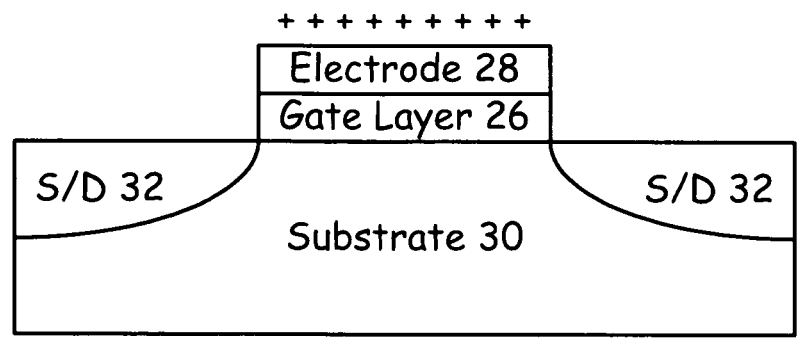
FIG. 3 is a cross sectional diagram of a gate layer with an induced charge, according to a preferred embodiment of the present invention.

After annealing, the substrate is preferably transferred to a measurement station 16 within the measurement system 10. Within the measurement station 16, a charge is preferably induced along the gate layer 26, as depicted in FIG. 3. FIG. 3 depicts a formed gate structure on a substrate 30, but it is appreciated that the methods as described herein are also applicable to gate layers 26 that have not yet been etched, as described below in greater detail.

The charge that is induced on the gate layer 26, such as through the electrode layer 28 as depicted in FIG. 3, preferably switches the gate on. A stimulation is preferably applied to one of the source drain regions 32, such as by corona or otherwise, and a response signal is preferably read at the other source drain region 32, such as voltage, surface photo voltage effect, or other, between switching the gate on and off. These readings can be taken such as with Kelvin electrodes, or otherwise. From these readings, characteristics such as leakage, threshold voltage, and carrier mobility can be determined.

According to one embodiment, the voltage threshold of the gate is determined by the equation:

$$V_{TH} = \left[\varphi_{ms} - \frac{Q_f}{C_{ox}} - \frac{Q_{it}(\varphi_{Si} = 2\varphi_F)}{C_{ox}}\right] + 2\varphi_F + \frac{\sqrt{4\varepsilon_{si}qN_A\varphi_F}}{C_{ox}}$$

Where:

$V_{Th}$ is the threshold voltage, $\phi_{ms}$ is work function between the substrate and the Kelvin probe, $Q_f$ is the fixed charge within the gate dielectric, $Q_{it}$ is the interface trap charge, $C_{ox}$ is the capacitance of the gate dielectric, $\phi_{si}$ is the substrate band bending voltage, $\phi_F$ is the potential difference between the Fermi level $E_F$ and the intrinsic Fermi level $E_i$, $\varepsilon_{si}$ is the permittivity of the semiconductor q is the magnitude of electronic charge, and $N_A$ is the acceptor impurity density.

The threshold voltage can also be measured according to the equation:

$$V_{TH} = V_{fb} + 2\varphi_F + \frac{\sqrt{4\varepsilon_{si}qN_A\varphi_F}}{C_{ox}}$$

Where $V_{fb}$ is the flat band voltage, as determined at the work function station 18. The work function station 18 preferably includes a reference surface such as, for example, a noble metal like gold or platinum, or a crystal structured or amorphous structured conducting or semiconducting surface that is enclosed in a chamber. The chamber is preferably adapted to selectively heat the reference surface, such as to a temperature of as much as about a few hundred centigrade, to thermally clear the surface origin mono layer of moisture. The chamber also preferably encloses the reference surface within a protective environment, such as in a relative vacuum or in an inert gas or less reactive gas, such as nitrogen. Thus, the flat band voltage and the interface trap density can be measured, and then the threshold voltage can be calculated as given by the expressions above.

Figure 4:
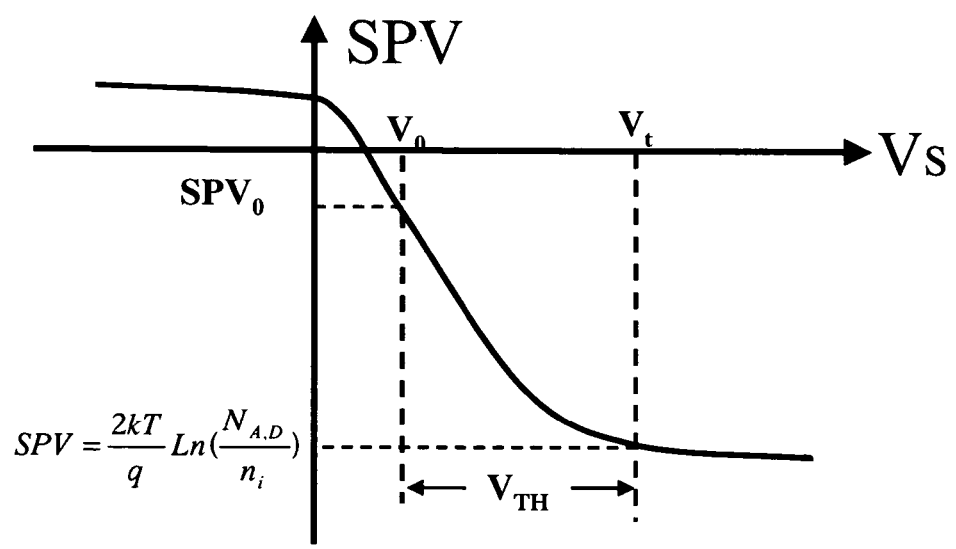
FIG. 4 is chart depicting a charge voltage method of measuring electrical properties of a gate according to a preferred embodiment of the present invention.

Alternately, a surface photo voltage versus surface voltage ($V_S$) curve can be measured along with the doping concentration in the well after a gate or poly process, as given in FIG. 4. From the curve, the initial $V_0/SPV_0$ can be determined. Then the $V_t$ is acquired at $SPV=2kT/q*Ln(N_A/n_i)$. Then, the threshold voltage is calculated from $V_t-V_0$. In this equation, Vt is the Vs voltage at the threshold of inversion, k is the Boltzmann constant, T is temperature, q is the magnitude of electronic charge, $N_A$ is the acceptor impurity density, $n_i$ is the intrinsic impurity density and $V_0$ is the initial surface voltage The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of measuring electrical characteristics of a gate dielectric on a semiconducting substrate at a measurement area, the method comprising the steps of:
    local annealing the measurement area by,
        directing a highly localized energy source at the measurement area, such that the measurement area is brought to an annealing temperature while surrounding structures are not significantly heated,
        while heating the measurement area, delivering a flow of a gas containing a percentage of at least one of hydrogen, deuterium, and water vapor at a flow rate to the measurement area, and
        while heating the measurement area, exhausting the flow of gas from the substrate,
    inducing a charge on the measurement area, and
    measuring the electrical characteristics of the gate dielectric.

2. The method of claim 1, wherein the highly localized energy source is at least one of a laser, a light source including ultraviolet, visible light, and infrared light, an electronic beam, and ion beam.

3. The method of claim 1, wherein the gas is delivered through a single nozzle that is disposed adjacent the measurement area.

4. The method of claim 1, wherein the gas is exhausted through a single nozzle that is disposed adjacent the measurement area.

5. The method of claim 1, wherein the percentage is between about five percent and about one hundred percent.

6. The method of claim 1, wherein the annealing temperature is between about twenty centigrade and about fifteen hundred centigrade.

7. The method of claim 1, wherein the electrical characteristics include at least one of gate leakage, voltage threshold, and carrier mobility.

8. The method of claim 1, wherein the charge on the measurement area is induced with at least one of a corona discharge and an electrical beam.

9. The method of claim 1, wherein the measurement area is formed in a test structure in a scribe line of a substrate on which integrated circuits are formed.

10. The method of claim 1, wherein the gate dielectric is disposed on a production substrate.

11. The method of claim 1, wherein the gate is disposed on a monitor substrate.

12. The method of claim 1, wherein the measurement area has a diameter of from about ten nanometers to about one hundred millimeters.

13. The method of claim 1, wherein the steps of inducing and measuring are performed without physically contacting surfaces of the substrate and the gate dielectric.

14. The method of claim 1, wherein the steps of inducing and measuring are performed by physically contacting at least one surface of the substrate and the gate dielectric.

15. The method of claim 1, wherein the step of measuring is performed in the presence of a background light.

16. The method of claim 1, further comprising the step of altering a parameter of a process tool in response to the measured electrical characteristics, using at least one of a feedback control, a feed forward control, and an in situ control.

17. The method of claim 1, wherein the method is performed during an integrated circuit fabrication process.

18. The method of claim 1, wherein the substrate comprises at least one of p type silicon, n type silicon, epitaxial silicon, a semiconducting material, a conductive material, silicon on insulator, and a film stack of at least one layer.

19. The method of claim 1, wherein the electrical characteristics include voltage threshold that is determined according to the equation:

$$V_{TH} = V_{fb} + 2\varphi_F + \frac{\sqrt{4\varepsilon_{si}qN_A\varphi_F}}{C_{ox}}.$$

* * * * *